United States Patent [19]

Nair

[11] 4,394,171

[45] Jul. 19, 1983

[54] THICK FILM CONDUCTOR COMPOSITIONS

[75] Inventor: Kumaran M. Nair, East Amherst, N.Y.

[73] Assignee: E. I. Du Pont de Nemours and Company, Wilmington, Del.

[21] Appl. No.: 354,814

[22] Filed: Mar. 10, 1982

Related U.S. Application Data

[63] Continuation-in-part of Ser. No. 289,114, Aug. 3, 1981, abandoned.

[51] Int. Cl.³ ............................................... C09D 5/24
[52] U.S. Cl. ................................. 106/1.14; 106/1.15; 106/1.19; 106/1.21; 252/514
[58] Field of Search .................. 106/1.14, 1.15, 1.19, 106/1.21; 252/514; 501/42

[56] References Cited

U.S. PATENT DOCUMENTS 3,408,311 10/1968 Short ................................. 252/514
3,854,957 12/1974 Larry ..................................... 106/1
4,090,009 5/1978 Horowitz ........................... 252/514

*Primary Examiner*—Lorenzo B. Hayes

[57] ABSTRACT

Metallization suitable for making printed thick film terminations comprising an admixture of finely divided particles of palladium/silver as the conductive phase and bismuth-free low-melting, low viscosity devitrifiable glass as the binder phase. The composition optionally contains a spinel-forming metal oxide to raise substrate adhesion.

10 Claims, No Drawings

THICK FILM CONDUCTOR COMPOSITIONS

CROSS REFERENCE TO PRIOR APPLICATION

This application is a continuation-in-part of pending application Ser. No. 289,114 filed Aug. 3, 1981, now abandoned.

FIELD OF THE INVENTION

The invention relates to thick film electrode compositions and especially to such compositions which are useful as terminations for hermetic ceramic capacitors.

BACKGROUND OF THE INVENTION

Thick film conductors serve as electrical interconnections between resistors, capacitors and integrated circuits. Thick film conductors are used in the microcircuit industry to "terminate" resistor or capacitor patterns, typically by firing the conductor pattern on a substrate and then printing the resistor or capacitor pattern over part of the conductor pattern and then firing them both.

Similarly to other thick film materials, thick film conductors are comprised of an active (conductive) metal and inorganic binder, both of which are in finely divided form and are dispersed in an organic vehicle. The conductive phase is ordinarily gold, palladium, silver, platinum or alloys thereof, the choice of which depends upon the particular performance characteristics which are sought, e.g., resistivity, solderability, solder leach resistance, migration resistance, bondability and the like.

The thick film techniques are contrasted with thin film techniques which involve deposition of particles by evaporation or sputtering. Thick film techniques are discussed in *Handbook of Materials and Processes for Electronics*, C. A. Harper, Editor, McGraw-Hill, N.Y., 1970, Chapter 12.

One of the most important factors in determining the adhesion performance of thick film conductors is the chemistry of the inorganic binder component. Three binder types are commonly used in thick film conductors: (1) glass; (2) oxide; and (3) mixtures of glass and oxide. In glass bonded systems, the glass typically migrates to the interface between the substrate and the conductive metal during firing and wets those surfaces. Fingers of glass extend from the substrate into the metal layer and sometimes even to the surface of the metal layer thus forming a mechanical bond.

A most common binder component in most solderable thick film conductor systems is bismuth oxide which facilities solderability and substrate adhesion. Bismuth oxide ($Bi_2O_3$) functions in this manner by providing a "fluxing" action to remove unwanted oxides and glass. In addition, it improves the efficiency of other binder components such as glass and oxides by facilitating their flow and migration to the conductor-substrate interface.

However, it has been found that many inorganic materials such as $Bi_2O_3$ nucleate and grow into a size far greater than the thickness of the printed and fired electrode film.

Such growths can protrude into the overprinted capacitor or resistor layers. Consequently, such crystalline functions can seriously interfere with the properties of the other thick film systems with which the conductor is used. For example, when a conductor of this type is used to terminate an overlying printed capacitor, the capacitor film is likely to exhibit degradation or even failure of its hermetic properties.

The degradation of the properties of resistor or capacitor layers terminated with conductor layers exhibiting such crystalline growth varies with the composition of the particular conductor. Nevertheless, it appears to be a function, inter alia, of the ionization-migration properties of the inorganic materials present in the underlying conductive composition.

The degradation and ultimate breakdown of dielectric properties is attributed to domain reorientation, ionization and ionic migration of the elements present in the dielectric materials, or impurities absorbed within the system, or ionization and migration of the ionizable species present in the electrode termination or all the above. Such ionization-migration of inorganic ions generally originates in the glass/frit component of the electrode composition. The ionization and migration of inorganic ions increases with the presence of easily ionizable inorganic oxides, i.e., when they are present as a separate phase, rather than as a component of the glass/frit.

A still further problem which is common with some thick film compositions is loss of silver during soldering, i.e., solder leaching, which drastically affects both the conductivity and solderability of the conductor. The problem is especially serious with silver-containing compositions. Furthermore, the problem is aggravated by the use of higher silver concentration, higher soldering temperatures and by longer times of exposure to hot solder.

BRIEF SUMMARY OF THE INVENTION

The above-described problems with the prior art conductors are overcome by the invention which is directed to a palladium/silver metallization for use in the manufacture of printing conductors which, by careful selection of the inorganic binder, excludes freely migratory, easily ionizable inorganic materials and also materials which will nucleate and grow during thick film firing conditions.

In particular the invention is directed to a palladium/silver metallization suitable for the manufacture of printed terminations, which is an admixture of:

A. 50–95% by weight finely divided particles of metallic materials comprising by weight
  (1) 6 to 60 parts palladium metal; and
  (2) 94 to 40 parts silver metal or alloys thereof in the same proportions; and B. 5 to 50% by weight finely divided particles of a bismuth-free low-melting, low viscosity, preferably devitrifiable glass.

In a further aspect the invention is directed to screen-printable paste comprising 82–97% by weight of the above-described metallization and 3–18% by weight finely divided particles of inorganic binder materials dispersed in organic medium. Still further, the invention is directed to conductive elements comprising a nonconductive ceramic substrate having a conductive pattern affixed thereon formed by printing a pattern of the above-described screen printable paste and firing the printed substrate to effect volatilization of the organic medium and sintering of the inorganic binder and metallization. In yet another aspect, the invention is directed to a process for making conductors comprising (a) applying a patterned thick film of the above-described screen printable paste to a nonconductive ceramic substrate, (b) drying the film at a temperature below 200° C. and (c) firing the dried film to effect sintering of the inorganic binder and metallization.

DETAILED DESCRIPTION OF THE INVENTION

A. Conductive Material

The finely divided metals used in the invention can be any of those palladium and silver powders which are commercially available for use in thick film conductors. The particle size of the above-described metallic materials is not narrowly critical from the standpoint of their technical effectiveness in the invention. However, they should, of course, be of a size appropriate to the manner in which they are applied, which is usually screen printing, and to the firing conditions. Thus the metallic material should be no bigger than 10 $\mu$m and preferably should be below about 5 $\mu$m. As a practical matter, the available particle size of the metals is as low as 0.1 $\mu$m for palladium and from 0.1 to 10 $\mu$m for silver.

The ratio of the Pd/Ag metal powders can vary between 0.06 and 1.5, preferably, between 0.06 and 0.5. The metal powders can have either flake or nonflake morphology. The nonflake powders can be irregularly shaped or spherical. By flake morphology is meant a metal powder whose predominant shape is flake as determined by scanning electron microscopy. Such flake silvers have an average surface area of approximately 1 $m^2/g$ and solids content of approximately 99-100% by weight. Nonflake silver powders typically have an average surface area of 1-2$m^2/g$ and solids content of approximately 99-100% by weight. The palladium metal powder has an average surface area of 5.0-15.0$m^2/g$, preferably, 7.0-11.0$m^2/g$ and solids content of approximately 99-100% by weight.

B. Inorganic Binder

The glass component of the thick film compositions of this invention is a low-softening point glass at 1-20 parts by weight level and, preferably, at 5-15 parts level. As used herein, the term low-softening point glass is one having a softening point below 600° C. and, preferably, below 400° C. as measured by the fiber elongation method (ASTM-C338-57). The glass utilized in this invention must have a low viscosity at the firing temperature to aid liquid phase sintering of inorganic particulates and preferably devitrifiable upon completion of the cooling at the end of the firing cycle. A glass having a specific viscosity (log $\mu$) of less than 6 at the firing temperature is particularly preferred. It is also preferred that the glass contain little or no easily ionizable inorganic materials.

Typical examples of glasses meeting the above criteria are lead germinate bismuth-free glasses containing, by weight, 50-80% $Pb_3O_4$ and 10-30% $GeO_2$. A particular preferred glass contains 78.5% $Pb_3O_4$ and 21.5% $GeO_2$.

The glasses are prepared by conventional glass-making techniques, by mixing the desired components in the desired proportions and heating the mixture to form a melt. As is well-known in the art, heating is conducted to a peak temperature and for a time such that the melt becomes entirely liquid and homogeneous. In the present work the components are premixed by shaking in a polyethylene jar with plastic balls and then melted in a platinum crucible at 825°-850° C. The melt is heated at the peak temperature for a period of 1-1½ hours. The melt is then poured into cold water. The maximum temperature of the water during quenching is kept as low as possible by increasing the volume of water to melt ratio. The crude frit after separation from water, is freed from residual water by drying in air or by displacing the water by rinsing with methanol. The crude frit is then ball-milled for 3-5 hours in alumina containers using alumina balls. Alumina picked up by the materials, if any, is not within the observable limit as measured by X-ray diffraction XRD) analysis.

After discharging the milled frit slurry from the mill, the excess solvent is removed by decantation and the frit powder is dried preferably at 100° C. The dried powder is then screened through a 325 mesh screen to remove any large particles.

The major two properties of the frit are: it aids the liquid phase sintering of the inorganic crystalline particulate matters; and form noncrystalline (amorphous) or crystalline materials by devitrification during the heating-cooling cycle (firing cycle) in the preparation of thick film compositions. This devitrification process can yield either a single crystalline phase having the same composition as the precursor noncrystalline (glassy) material or multiple crystalline phases with different compositions from that of the precursor glassy material.

C. Metal Oxide

The compositions of the invention, as described have quite satisfactory adhesion for most applications. Nevertheless, it has been found that the adhesion of the metallization to solder and to the substrate can be improved still further by the addition of certain metal oxides (MeO). Therefore, for many applications it is preferred to include in the composition 0.1 to 10% by weight MeO, basis total solids, i.e., basis the total weight of conductive material, inorganic binder and metal oxide. For most applications 1-5% by weight MeO is preferred.

The metal oxides which are suitable for the practice of the invention are those which are capable of reacting with $Al_2O_3$ to form a spinel structure when the composition of the invention is fired. ($MeAl_2O_4$) While the exact mechanism by which these metal oxides function is not known, it is believed that the metal oxides are transported through the glass phase to the ceramic substrate where they interact with the surface of the $Al_2O_3$ substrate to form a mechanically strong spinel structure.

Suitable inorganic oxides are those based upon $Zn^{2+}$, $Mg^{2+}$, $Co^{2+}$, $Ni^{2+}$, $Fe^{2+}$, and $Mn^{2+}$ ions. Precursors of the metal oxides such as carbonates and oxylates, which will decompose under firing conditions to form the corresponding metal oxides, may be used with comparable effectiveness. Consequently, as used herein within this context, the terms MeO and metal oxides include such precursors as well.

The particle size of the metal oxides or precursors should be of a size appropriate to the manner in which the composition of the invention is applied, which is usually by screen printing. Thus the particle size should be no larger than about 15 $\mu$m and preferably should be below about 5 $\mu$m.

D. Organic Medium

The inorganic particles are mixed with an inert liquid medium (vehicle) by mechanical mixing (e.g., on a roll mill) to form a paste-like composition having suitable consistency and rheology for screen printing. The latter is printed as a "thick film" on conventional ceramic substrates in the conventional manner.

Any inert liquid may be used as the vehicle. Various organic liquids, with or without thickening and/or stabilizing agents and/or other common additives, may be used as the vehicle. Exemplary of organic liquids which can be used are the aliphatic alcohols esters of such alcohols, for example, acetates and propionates, terpenes such as pine oil, terpineol and the like, solutions of resins such as the polymethacrylates of lower alcohols, and solutions of ethyl cellulose in solvents such as pine oil, and the onobutyl ether of ethylene glycol monoacetate. A preferred vehicle is based on ethyl cellulose and beta terpineol. The vehicle may contain volatile liquids to promote fast setting after application to the substrate.

The ratio of vehicle to solids in the dispersions can vary considerably and depends upon the manner in which the dispersion is to be applied and the kind of vehicle used. Normally to achieve good coverage the dispersions will contain complementally, 60-90% solids and 40-10% vehicle. The compositions of the present invention may, of course, be modified by the addition of other materials which do not affect its beneficial characteristics. Such formulation is well within the skill of the art.

The pastes are conveniently prepared on a three-roll mill. A preferred viscosity of these compositions is approximately 100-150 Pa.S, measured on a Brookfield HBT viscometer using #5 spindle at 10 RPM and the amount of vehicle utilized is determined by the final desired formulation viscosity.

FORMULATION AND APPLICATION

In the preparation of the composition of the present invention, the particulate inorganic solids are mixed with the organic carrier and dispersed with suitable equipment, such as a three-roll mill, to form a suspension, resulting in a composition for which the viscosity will be in the range of about 100-150 pascal-seconds at a shear rate of 4 $sec^{-1}$.

In the examples which follow, the formulation was carried out in the following manner:

The ingredients of the paste, minus about 5% of the organic components, are weighed together in a container. The components are then vigorously mixed to form a uniform blend; then the blend is passed through dispersing equipment, such as a three roll mill, to achieve a good dispersion of particles. A Hegman gauge is used to determine the state of dispersion of the particles in the paste. This instrument consists of a channel in a block of steel that is 25 $\mu m$ deep (1 mil) on one end and ramps up to 0" depth at the other end. A blade is used to draw down paste along the length of the channel. Scratches will appear in the channel where agglomerates' diameter is greater than the channel depth. A satisfactory dispersion will give a fourth scratch point of 10-18 $\mu m$ typically. The point at which half of the channel is uncovered with a well dispersed paste is between 3 and 8 $\mu m$ typically. Fourth scratch measurement of >20 $\mu m$ and "half-channel" measurements of >10 $\mu m$ indicate a poorly dispersed suspension.

The remaining 5% consisting of organic components of the paste is then added, and the resin content is adjusted to bring the viscosity when fully formulated to between 100 and 150 Pa.s at a shear rate of 4 $sec^{-1}$.

The composition is then applied to a substrate, such as alumina ceramic, usually by the process of screen printing, to a wet thickness of about 10-30 microns, preferably 10-15 microns. The electrode compositions of this invention can be printed onto the substrates either by using an automatic printer or a hand printer in the conventional manner. Preferably automatic screen stencil techniques are employed using a 200 to 325 mesh screen. The printed pattern is then dried at below 200° C., e.g., about 150° C., for about 5-15 minutes before firing. Firing to effect sintering of both the inorganic binder and the finely divided particles of metal is preferably done in a well ventilated belt conveyor furnace with a temperature profile that will allow burnout of the organic matter at about 300°-600° C., a period of maximum temperature of about 800°-950° C. lasting about 5-15 minutes, followed by a controlled cooldown cycle to prevent over-sintering, unwanted chemical reactions at intermediate temperatures, or substrate fracture which can occur from too rapid cooldown. The overall firing procedure will preferably extend over a period of about 1 hour, with 20-25 minutes to reach the firing temperature, about 10 minutes at the firing temperature, and about 20-25 minutes in cooldown.

The fired thickness of the conductor can range from about 6 to about 15 microns, depending on the percent solids, the type of screen the composition is printed with, the printer setup, and the degree of sintering of the inorganic solids.

DEFINITIONS AND TEST PROCEDURES

1. Solder Adhesion

The solder-adhesion properties of the electrode composition of the invention are evaluated as follows:

a. The electrode composition is printed using an automatic printer and 200 mesh adhesion pattern screen, dried at elevated temperatures such as 125° C. for approximately 15 minutes and fired in air in a belt furnace at a peak temperature of 850° C. for 10 minutes;

b. Tin coated copper lead wires are placed over the pattern and dipped in Sn/Pb/Ag or Sn/Pb solder;

c. Initial solder-adhesion pull values are determined using an Instron instrument at a pull rate of 20 inches per minute. The force in pounds (lbs) required to pull out the wires is taken as the measure of adhesion.

d. The above-described electrode adhesion patterns printed onto alumina substrates are soldered and stored at 100°-150° C. in an oven for various periods of time, prior to the determination of aged adhesion values.

2. Dielectric Constant (K)

Dielectric constant is a measure of the ability of a dielectric material to store an electrical potential under the influence of an electrical field. Thus the ratio between the capacitance of a capacitor using the material as dielectric (ceramic in this case) to the capacitance with a vacuum as the dielectric.

3. Dielectric Material

Dielectric material is a nonconducting material or insulator that separates electrical charges and can result in the storage of an electrical charge.

4. Dissipation Factor (DF)

Dissipation factor is a measure of internal losses due to conduction through the dielectric from one lead to the other. This power loss results in the thermal dissipation of electrical energy which is undesirable because it raises the temperature of the device.

5. Insulation Resistance (IR)

Insulation resistance is a measure of electricity leakage through the dielectric. The D.C. resistance is measured at certain volts applied across the terminals of the circuit.

Capacitance and dissipation factors are measured using a Hewlett-Packard HP4274A multi-frequency LCR meter, while insulation resistance is measured using Super megohm meter Model RM 170 (Biddle Instruments, AVO, Ltd., U.K. ). Insulation resistance measurements are made after charging the capacitor with 100 VDC. Each number is the average of at least 10 measurements. The thickness of the dielectric layer is measured using Gould Surfanalyzer 150/recorder 250. The dielectric constant is calculated using the equation:

$$K = \frac{C}{A} \cdot t$$

where

C is the capacitance of the capacitor

A—is the area of small electrode in contact with the dielectric layer t—is the thickness of the dielectric layer.

All capacitors were aged for at least 15 hours after firing before making the electrical measurements. It is common that the dissipation factor (DF) decreases by 0.5–2% within this aging time period. However, the capacitance is generally unaffected during this period.

6. Hermeticity

The reversible absorption of water leading to high DF and low IR of the capacitors is evaluated using a water immersion test. This test is used as the measure of the hermeticity of the capacitor. Three sets of capacitors are immersed in water at a temperature of 50° C. and kept under water for a maximum of 10 days. A "2095 Bath and Circulator" of Master Line, Forma Scientific, is used for the test. A first set of capacitors is taken out after a period of 24 hours, a second set after 5 days and a third set after 10 days. Surface water is wiped off using microwipes and insulation resistance is measured after charging the capacitor with 100 volts DC. Capacitors are allowed to recover and the insulation resistance is remeasured. The same set of capacitors are then immersed in water for an additional 10 days and the insulation resistance is measured again. Capacitors aged under water showed little drop in the insulation resistance which is taken as the measure for the hermetic seal.

7. Dielectric Compatibility

The compatibility of the electrode compositions of the invention was evaluated using dielectric compositions. The following procedure is used for producing a thick film capacitor.

1. The below-described electrode composition was printed using an automatic printer, dried at 120° C. for approximately 15 minutes and fired in air in a belt furnace at a peak temperature in approximately 825°–925° C. for 10 minutes, with a total firing cycle of 1–1.5 hours. The fired thickness was 10–14 μm, as measured by a Surfanalyzer;

2. One layer of a dielectric composition was printed over the electrode film using a double wet pass with the squeegee and dried at 125° C. for approximately 15 minutes;

3. A second layer of the dielectric composition was printed over that of the first layer and it also was dried at 125° C. for 15 minutes;

4. Finally, the electrode composition was printed on the top of the dielectric layer, and dried at 125° C. for approximately 15 minutes. The two dielectric layers and the top electrode were then fired in air in a belt furnace at a peak temperature of approximately 825°–950° C. for 10 minutes, the total firing cycle being 1–1.5 hours. The fired thickness of the two dielectric layers together was 30–60 μm as measured in a Surfanalyzer.

8. Solder Leach Resistance

The solder leach resistance tests were performed as follows: The fired parts were dipped in a mildly active flux such as Alpha 611, then heated for 5 seconds by dipping the edge of the ceramic chip in the molten solder. The chip was then submerged in the solder for 10 seconds, then withdrawn, cleaned, and inspected. Failure was determined by the number of dips necessary to cause a break in a 20 mil wide serpentine conductor line. Dewetting of the conductor and loss of conductor lines indicates that solder leaching has taken place.

EXAMPLES

The invention will be further understood by reference to the following examples.

EXAMPLE 1

Using the above-described test procedures, a series of conductors was prepared in accordance with the invention and compared with a prior art conductor containing bismuth incorporated into the binder component. Various combinations of the invention and prior art conductors were used to terminate three different dielectric compositions and the IR was measured after 10 days under water.

The prior art conductor composition, which is available commercially, had the following composition:

| | |
|---|---|
| Silver Powder | 44.3% wt |
| Palladium Powder | 17.8 |
| Inorganic Binder | 15.9 |
| Organic Medium | Balance |

The inorganic binder composition was a conventional bismuth-containing glass having the following composition:

| | |
|---|---|
| $Bi_2O_3$ | 75.1% wt |
| PbO | 10.9 |
| $SiO_2$ | 9.3 |
| CaO | 2.4 |
| $B_2O_3$ | 1.2 |
| $Al_2O_3$ | 1.1 |
| Total | 100 |

Two compositions in accordance with the invention were made having the following composition:

| | A | B |
|---|---|---|
| Palladium Powder | 17.8% wt | 16.5% wt |
| Silver Powder | 44.3 | 43.3 |
| Inorganic Binder ($Pb_5Ge_3O_{11}$) | 15.9 | 15.9 |
| Organic Medium | Balance | Balance |

When the three conductors were compared as to solder adhesion, it was found that the composition of the invention had approximately the same initial solder adhesion properties and also upon aging 24 hours at 135° C. However, they were somewhat, though acceptably, lower than the prior art conductor material after aging at 150° C.

This can be seen by reference to the data from these tests which are summarized in Table 1 immediately below.

TABLE 1

COMPARATIVE SOLDER ADHESION VALUES

| Solder-Adhesion (lbs) | 1 | 2 | Commercial Electrode |
|---|---|---|---|
| Initial (single fired) | 6.7 | 7.7 | 7.4 |
| Aged at 135° C. for 24 hr | 4.7 | 5.4 | 5.0 |
| Aged at 150° C. for 24 hr | 2.9 | 3.7 | 5.0 |
| Initial (double fired) | 6.6 | 7.9 | 7.9 |
| Aged at 135° C. for 24 hr | 4.0 | 4.4 | 4.7 |
| Aged at 150° C. for 24 hr | 2.0 | 3.4 | 4.7 |

EXAMPLE 2

Using procedure 7 above, the dielectric compatibility of Sample A and the prior art (P) conductor (described in Example 1) were used both separately and in combination to terminate three different capacitors. Four configurations were used as follows:

| Configuration | 1 | 2 | 3 | 4 |
|---|---|---|---|---|
| Top Electrode | P | P | A | A |
| Bottom Electrode | P | A | P | A |

Each configuration was tested with respect to insulating resistance (IR) after immersion in water at 50° C. for 10 days. For comparison, the initial IR of Configuration 1 was also tested. The three capacitors are characterized by their dielectric constant (K) and dissipation factor (DF). These data are given in Table 2 below.

TABLE 2

INSULATION RESISTANCE PROPERTIES

| Configuration 1 | | | |
|---|---|---|---|
| K | 59 | 97 | 156 |
| DF (%) | 1.0 | 1.3 | 1.4 |
| IR, initial ($\Omega$) | $>10^{10}$ | $>10^{9}$ | $>10^{10}$ |
| IR, 10 days ($\Omega$) | $>10^{7}$ | $>10^{6}$ | $>10^{6}$ |
| Configuration 2 | | | |
| IR, 10 days ($\Omega$) | $>10^{8}$ | $>10^{6}$ | $>10^{6}$ |
| Configuration 3 | | | |
| IR, 10 days ($\Omega$) | $>10^{8}$ | $>10^{8}$ | $>10^{8}$ |
| Configuration 4 | | | |
| IR, 10 days ($\Omega$) | $>10^{9}$ | $>10^{9}$ | $>10^{9}$ |

The data for Configuration 2 show that the use of the invention composition for the lower electrode alone gave an improvement in IR reduction for the lowest dielectric material. However, in Configuration 3 it was found that the IR reduction after 10 days under water had improved substantially for all three capacitors. Finally, a still further substantially improvement in IR reduction was observed for all three capacitor materials when the invention compositions were used for both the top and bottom electrodes (Configuration 4).

EXAMPLE 3

Using the test procedures described above, a series of conductors was prepared from three thick film paste compositions in accordance with the invention containing a spinel-forming metal oxide and having varying ratios of palladium to silver. Each of the pastes contained 74% by weight solids and 26% by weight organic medium. The conductors were fired at 850° C. either one or three times and solder adhesion was tested with two solder compositions both initially and after 48 hours of aging at 150° C. In addition, the solder leach resistance of each sample was tested. The composition of the paste compositions and the properties of the conductors prepared therefrom are given in Table 3 below.

TABLE 3

EFFECT OF PD/AG RATIO ON SOLDER ADHESION

| Sample Designation | A | | B | | C | |
|---|---|---|---|---|---|---|
| Component | Composition, % wt. | | | | | |
| Silver Powder | 70.3 | | 73.0 | | 77.0 | |
| Palladium Powder | 13.5 | | 10.8 | | 6.8 | |
| Zinc Oxide | 2.7 | | 2.7 | | 2.7 | |
| Inorganic Binder ($Pb_5Ge_3O_{11}$) | 13.5 | | 13.5 | | 13.5 | |
| (Ag/Pd) | (5.2) | | (6.8) | | (11.3) | |
| 62/36/2 Sn/Pb/Ag | Adhesion (lbs.) | | | | | |
| | 0 | 48 hrs | 0 | 48 hrs | 0 | 48 hrs. |
| Fired 1X | 6.4 | 4.0 | 6.7 | 4.2 | 6.6 | 4.5 |
| Fired 3X | 6.8 | 3.1 | 6.6 | 3.1 | 7.0 | 4.4 |
| 10/90 Pb/Sn | | | | | | |
| Fired 1X | 5.3 | 4.4 | 5.2 | 4.3 | 4.6 | 4.2 |
| Fired 3X | 4.9 | 4.0 | 5.1 | 4.6 | 4.9 | 3.7 |

The foregoing data show that the adhesion properties of the inventive compositions were quite satisfactory with both types of solder and that the deterioration of adhesion with aging was well within acceptable limits. In addition, there was no significant trend of difference between single and multiple firing of the conductors.

EXAMPLE 4

Two further conductor compositions were prepared containing the same ratio of silver to palladium, but only one of which contained spinel-forming metal. A series of conductors was prepared therefrom which was tested as described above the adhesion and solder leach resistance. The composition of the paste compositions, each of which contained 26% by weight organic medium, and the properties of the conductors prepared therefrom are given in Table 4 below.

TABLE 4

EFFECT OF SPINEL-FORMING OXIDE ON SOLDER ADHESION AND LEACH RESISTANCE[1]

| Sample Designation | D | | E | |
|---|---|---|---|---|
| Component | Composition, % wt. | | | |
| Silver Powder | 77.3 | | 79.0 | |
| Palladium Powder | 8.0 | | 8.2 | |
| Zinc Oxide | 2.7 | | — | |
| Inorganic Binder ($Pb_5Ge_3O_{11}$) | 12.0 | | 12.3 | |
| (Ag/Pd) | (9.7) | | (9.7) | |
| 62/36/2 Sn/Pb/Ag | Adhesion (lbs.) | | | |
| | 0 | 48 hrs | 0 | 48 hrs |
| Fired 1X | 8.6 | 5.6 | 6.0 | 0.5 |

[1]Solder 62/36/2 Sn/Pb/Ag

The adhesion of the conductor prepared from the thick film composition containing the spinel-forming metal oxide was markedly superior to the one which contained none of that material. Moreover, the solder leach resistance of the zinc oxide-containing conductors was observed to be at least five times better than the ones which contained none of that spinel-forming material.

The exact parameters which are needed to give the property of hermeticity in thick film capacitors are not known with certainty; however certain mechanisms can be postulated. For example, the lowering of insulation resistance when the capacitors are exposed to humidity is probably related to an ionization and diffusion of cations from the anodic electrode into the dielectric toward the cathodic electrode via grain boundaries, pores and voids. This ionization and ionic migration process is pronounced in the case of electrode compositions containing easily ionizable oxides such as $Bi_2O_3$. The presence of water active inorganic materials as a second phase increases the rate of such ionization processes. Also, the porosity of the terminations may activate the process by producing more surface area for water contact.

The electrode of this invention is completely dense because (1) of the liquid phase sintering and devitrification of the $Pb_5Ge_3O_{11}$ glass along the grain boundaries and (2) of the absence of any easily ionizable inorganic species. So under humid conditions, the electrode does not contribute mobile ions and/or allow the migration of protons into the dielectric. Since $Bi_2O_3$-like materials are highly ionizable under water and $Bi^{3+}$ ions are mobile, elimination of $Bi_2O_3$ and similar materials from the system reduces most of the ionic migration.

In ordinary capacitors, a glass or organic encapsulation coating is needed to obtain satisfactory hermeticity. However, the data show that no such exceptional encapsulated procedures are needed for the composition of the invention.

I claim:

1. A palladium/silver metallization suitable for the manufacture of printed terminations, which is an admixture of:
    A. 50-95% by weight finely divided particles of metallic materials comprising by weight
        (1) 6 to 60 parts palladium metal;
        (2) 94 to 40 parts silver metal or alloys thereof in the same proportions; and
    B. 5-50% by weight finely divided particles of a bismuth-free low-melting, low viscosity devitrifiable glass comprising 50-80% by weight $Pb_3O_4$ and 10-30% $GeO_2$.

2. The metallization of claim 1 in which the weight ratio of Pd/Ag is from 0.06 to 1.5.

3. The metallization of claim 1 which also contains 0.1-10% by weight inorganic metal oxide capable of reacting with $Al_2O_3$ to form a spinel structure.

4. The metallization of claim 3 in which the spinel-forming component is an oxide or oxide precursor of a divalent metal selected from the group consisting of Zn, Mg, Co, Ni, Fe and Mn.

5. A screen-printable paste comprising 82-97% by weight of the metallization of claim 1 dispersed in 3-18% by weight organic medium.

6. The screen-printable paste of claim 5 in which the organic medium is a solution of ethyl cellulose and beta terpineol.

7. The screen-printable paste of claim 5 in which the weight ratio of Pd/Ag is from 0.06 to 1.5.

8. The screen-printable paste of claim 6 in which the glass contains by weight 50-80% by weight $Pb_3O_4$ and 10-30% by weight $GeO_2$.

9. The screen-printable paste of claim 5 which also contains 0.1-10% by weight inorganic metal oxide capable of reacting with $Al_2O_3$ to form a spinel structure.

10. The screen-printable paste of claim 9 in which the spinel-forming component is an oxide or oxide precursor of a divalent metal selected from the group consisting of Zn, Mg, Co, Ni, Fe and Mn.

* * * * *